United States Patent [19]

Thornton

[11] Patent Number: 5,319,655
[45] Date of Patent: Jun. 7, 1994

[54] MULTIWAVELENGTH LATERALLY-INJECTING-TYPE LASERS

[75] Inventor: Robert L. Thornton, East Palo Alto, Calif.

[73] Assignee: Xerox Corporation, Stamford, Conn.

[21] Appl. No.: 994,024

[22] Filed: Dec. 21, 1992

[51] Int. Cl.$^5$ ............................................. H01S 3/10
[52] U.S. Cl. ..................................... 372/23; 372/45; 372/50
[58] Field of Search .................... 372/20, 23, 43, 45, 372/50

[56] References Cited

U.S. PATENT DOCUMENTS

| | | | |
|---|---|---|---|
| 4,476,563 | 10/1984 | Van Ruyven | 372/50 |
| 4,786,918 | 11/1988 | Thornton et al. | 346/108 |
| 5,038,185 | 8/1991 | Thornton | 357/17 |
| 5,164,949 | 11/1992 | Ackley et al. | 372/45 |
| 5,216,443 | 6/1993 | Thornton et al. | 346/108 |
| 5,223,723 | 6/1993 | Luryi | 257/184 |

OTHER PUBLICATIONS

R. L. Thornton, "Integrated Optoelectronics for Communication and Processing", SPIE, vol. 1582, Sep. 3-4, 1991, Boston, Mass., pp. 194-205.

*Primary Examiner*—Frank Gonzalez
*Attorney, Agent, or Firm*—Rosen, Dainow & Jacobs

[57] ABSTRACT

Multiwavelength laser sources that are precisely aligned relative to each other and suitable, for instance, for multistation, multicolor ROS. The device is made by growing on a semiconductor substrate a set of epitaxial layers in a laterally injecting laser configuration with progressively narrower bandgap quantum well active regions (and therefore progressively longer wavelength operation) towards the surface of the crystal. Selective etching can then be used to remove all quantum wells with emissions shorter than the ultimately desired wavelength in a given cavity. This approach can be applied to three different types of laser structures; conventional edge emitting lasers, grating surface emitting lasers, and vertical surface emitting lasers. Also described is a vertical cavity, surface-emitting laser with lateral injection employing a reflector structure comprised of a III-V semiconductor layer beneath the active region, and a reflecting mirror above the active region.

24 Claims, 3 Drawing Sheets

MULTIWAVELENGTH LATERALLY-INJECTING-TYPE LASERS

RELATED CASE

Commonly-owned, copending application, Ser. No. 07/994,029, filed Dec. 21, 1992, entitled "MULTI BEAM SOLID QW STATE LASER USING CONFIGURED STACKED LASERS" is still pending.

This invention relates to a solid-state laser capable of supplying one or more radiation beams of different wavelengths.

BACKGROUND OF THE INVENTION

A surface skimming laser is a semiconductor light emitting device of diverse and important applications as a result of the close proximity of the laser active region to the surface of the crystal, and the transverse or lateral injection of current into the structure from a diffused p-n junction.

See, for example, my paper in SPIE, Vol. 1582, Integrated Optoelectronics for Communication and Processing (1991), pages 194–205, and a commonly-owned USA patent in my name, U.S. Pat. No. 5,038,18 ('185), the contents of which paper and patent are herein incorporated by reference.

It is also well known that solid state sources offer unique advantages when used as illuminators for an electrooptic modulator or light valve for printing applications. See, for example, commonly assigned U.S. Pat. No. 4,786,918 ('918). A very desirable enhancement to the performance of this modulator can be achieved by fabricating two sources in close proximity, preferably on the same wafer, with a relative wavelength shift of several nanometers. By using dispersive elements, this wavelength shift can be converted into a linear relative displacement of the light spots in the image plane for the two sources, resulting in an angular displacement of the two beams in a plane beyond that of the beam scanning mechanism, thus enabling the two beams to be sent to different developing stations to facilitate multi-color Xerography. Although there is some wavelength shift that can be realized by varying the drive conditions of the semiconductor laser used in the modulator described in the '918 patent, the shift is in general not great enough for convenient design of the dispersive elements required for this increased performance device.

Moreover, the laser device described in said '918 patent is not of the laterally-injecting nor of the surface-skimming type and therefore does not offer the benefits of the surface-skimming-type laser described in my paper and the '185 patent.

SUMMARY OF INVENTION

An object of the invention is a laterally-injecting-type laser whose wavelength output is easily selected from among several different values.

Another object is a surface-skimming laser whose wavelength output can be varied.

A further object of the invention is multiwavelength laser sources precisely aligned relative to each other.

Still another object of the invention is a multiwavelength monolithic device in which the active laser structures are of the laterally-injecting or surface-skimming type.

In accordance with one aspect of this invention, a laterally-injecting or surface-skimming-type laser device comprises on a common substrate a set of epitaxial layers containing a lower cladding layer and at least two active region layers tuned to different wavelengths, with one of the active region layers adjacent the cladding layer, and the other active region layer adjacent said one layer and closer to the upper active surface of the structure. Means are providing for causing current to flow laterally through the structure in a direction parallel to the plane of the layers in a magnitude such that the one of the active regions capable of lasing at the longer wavelength will be caused to lase.

In a preferred embodiment, the other layer has an active region capable of lasing at a longer wavelength than that of the active region of the one layer. In particular, I prefer the layers to be arranged such that the active region closest to the substrate has the widest bandgap, therefore will lase at the shortest wavelength, and the remaining active regions as the topmost active surface is approached have progressively narrower bandgap quantum wells, therefore will lase at progressively longer wavelengths. With this arrangement, when plural active regions are present, the active region closest to the active surface--lasing at the longest wavelength--will become active and lase when current is supplied. The other active regions will not be activated and will not lase.

In accordance with a further aspect of the present invention, a lateral injection laser is provided but with vertical emission of radiation. In this case, the reflecting pair forming the optical cavity is provided by a buried reflecting region located below one or more active regions, and a top reflecting region provided above the one or more active regions.

In accordance with a further feature of the invention, active regions can be removed, from the topmost active surface downwardly, to leave and thus select an active region in the structure whose lasing wavelength is desired. By appropriate placement of contacts and isolation regions, and selective removal of active regions, a multiwavelength diode laser results with precisely controlled spacing and alignment.

In accordance with a preferred method of the invention, etch-stop layers are provided between each of the layers containing the different active regions. Using these etch-stop layers, different regions of the semiconductor body can be easily etched off to provide at different locations of the body closest to the active surface active regions capable of lasing at different wavelengths. When appropriate contacts are provided a set of precisely-dimensioned, multi-frequency lasers on the same substrate is produced.

The use of the invention results in a method for achieving independently addressable lasers on the same substrate that are physically separated by a very small distance yet are separated by a controllably large separation in wavelengths. This wavelength separation is determined during the growth of the epitaxial layers, and is therefore a design parameter independent of the drive conditions of the device.

The above and further objects, details and advantages of the present invention will become apparent from the following detailed description of preferred embodiments thereof, when read in conjunction with the accompanying drawings.

DETAILED DESCRIPTION OF PREFERRED EMBODIMENTS

My referenced paper and the '185 patent describe very completely the geometry of the surface-skimming-type of diode laser, and especially the importance of the active regions being close to the active surface of the device. The surface-skimming laser structure is characterized by an optical waveguide structure such that the optical mode is sufficiently confined to the structure's surface and the optical field is strong in very close proximity to that surface, referred to herein as the active surface. This is the topmost surface of the structure. Air is a critical component in the waveguide and bounds active surface. The referenced paper and patent also describe in detail how to achieve such structures, which are typically built up of III-V semiconductor materials. Those same materials and techniques can be used to construct a surface-skimming laser in accordance with the present invention, except that plural layers providing plural active regions are stacked over the substrate, with the active regions having different compositions such that they are capable when excited of lasing at different wavelengths. The surface-skimming laser structures produced in accordance with the invention are capable of many different types, such as edge-emitting lasers, grating lasers, and vertical cavity emitting lasers. The first two laser types have been described in the referenced paper and patent. The third type is described below.

Figure 1:
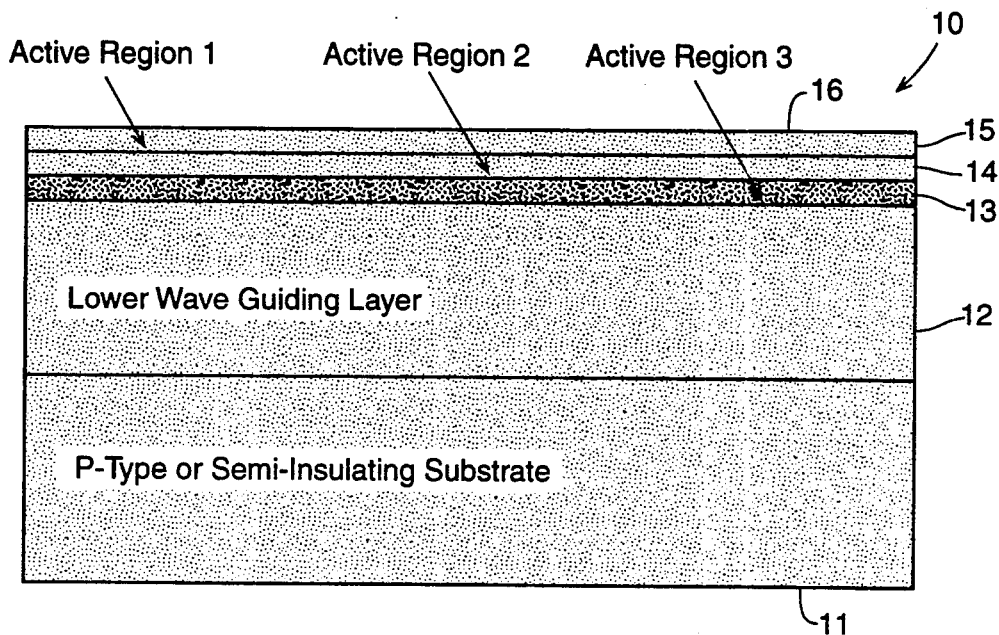
FIG. 1 is a schematic cross-sectional view of one form of semiconductor structure that can be used to make a laser in accordance with the invention.

The basic device structure is illustrated in FIG. 1 (not to scale), wherein a semiconductor body 10 comprises a P-type or semi-insulating substrate 11 on which is grown in succession, typically by well-known MOCVD processes, a thick lower waveguiding or cladding layer 12, and thin layers 13-15, each of which can constitute one of three active regions of a surface-skimming laser. As one example, not meant to be limiting, the substrate 11 is of GaAs, the cladding layer 12 of AlGaAs, the layer 13 containing a third active region of $Ga_{0.5}In_{0.5}P$, the active layer 14 containing a second active region of $Al_{0.5}Ga_{0.9}As$, and the active region 15 containing a first topmost active region of $In_{0.1}Ga_{0.9}As$. Well-known buffer layers and etch-stop layers are not shown. The compositions of the active layers 13-15 are chosen such that the first active layer 15, closest to the active surface designated 16, has the shortest bandgap and is thus capable of lasing at the longest wavelength, and the bandgap and lasing wavelengths of the two remaining layers 14 and 13 progressively increase, respectively decrease, as their distance from the active surface 16 progressively increases toward the substrate 11.

From the structure illustrated in FIG. 1 can be constructed a single surface-skimming laser having one of three selected wavelengths, dual surface-skimming lasers having two different wavelengths selected from among three possible values, or a tri-beam emitting surface-skimming laser emitting at three different wavelengths. Wavelength selection is achieved by providing closest to the active surface the active region with the desired wavelength. By providing appropriate contacts and other known isolation regions, and selectively removing at two or more body locations one or more active layers portions starting from the active surface 16, plural laser structures result each of which can be separately addressed, and each of which may have remaining closest to the active surface one of three of the active regions. If all three are exposed, then tri-wavelength emission from the multiple active region surface-skimming lasers results.

Figure 2:
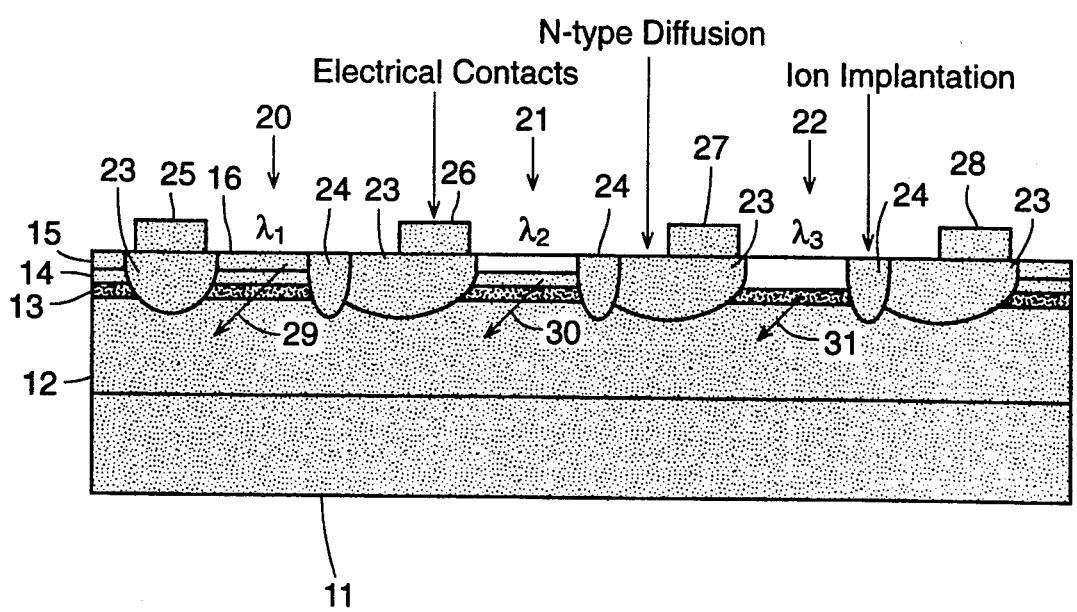
FIG. 2 is a cross-sectional view of one form of tri-wavelength laser in accordance with the invention.

An example of the latter is depicted in FIG. 2. Three different lasers are indicated at 20, 21 and 22. Each is separated by an N-type diffused region 23, for example, of silicon, and ion-implanted regions 24, for example of hydrogen, which penetrate through active layers 13-15 down into the cladding diffused and implanted regions function to provide electrical and optical isolation between the three lasers, as well as provide the electrical structure for the necessary lateral current flow, when voltage is applied between electrical contacts 25-28, for example of gold, provided on top of the diffused regions 23. With this structure, the light emission is from the edges, indicated by the arrows 29-31. Optical facets at the front and rear surfaces to form the laser cavities as is well-known are not shown.

As will be observed in FIG. 2, the active layer closest to the surface 16 in the first laser 20 is layer 15, which will lase at approximately 950 nm ($\lambda_1$). The layer portion 15 at the second laser 21 has been removed exposing the second active layer 14 which will lase at approximately 850 nm ($\lambda_2$). Both layer portions 13 and 14 at the third laser 22 have been removed exposing the third active layer 13 which will lase at approximately 650 nm ($\lambda_3$). Each of the lasers 20-22 can be addressed by applying potentials to the adjacent electrodes defining the lateral boundaries of the active layer. For example, the first laser 20 is addressed by applying a potential between contacts 25 and 26. Alternatively, two or all three of the lasers can be simultaneously activated by applying appropriate potentials to their respective flanking electrodes.

Figure 3:
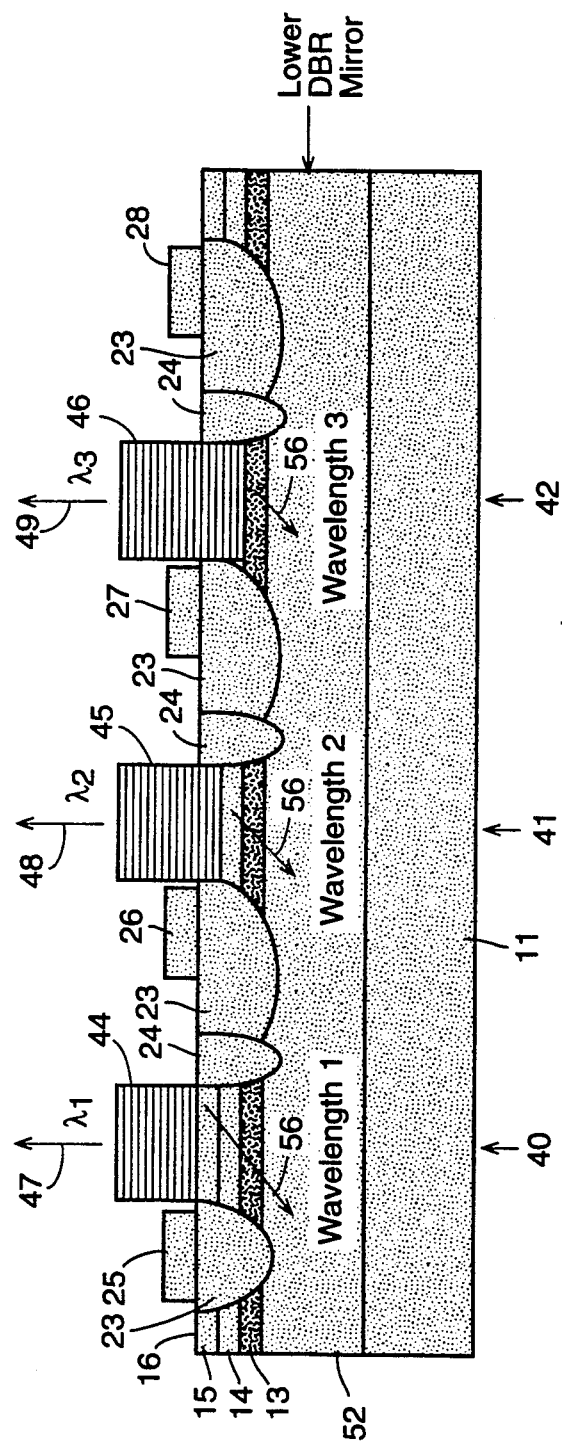
FIG. 3 is a cross-sectional view of another form of tri-wavelength laser in accordance with the invention.

FIG. 3 is a view similar to FIG. 2 of another form of multiple active region, lateral-injecting laser providing multiple wavelength emission from a monolithic structure. The same reference numerals are used for similar elements. As in the FIG. 2 embodiment, a tricolor laser structure is realized by leaving the entire structure intact for a long wavelength laser 40, removing the topmost active layer or longest wavelength structure 15 for a middle wavelength laser 41, and removing the two uppermost active regions layers 15, 14 for the shortest wavelength laser 42. Now, by replacing the lower waveguiding layer 12 of FIG. 2 with a distributed Bragg reflector (DBR) mirror 52 of sufficiently broad bandwidth, and depositing dielectric stack mirrors 44, 45, 46 on the exposed surfaces, respectively, of the three active regions 15, 14 and 13, then three vertical cavity surface emitting lasers result, with the direction of the output beams at wavelengths $\lambda_1$, $\lambda_2$ and $\lambda_3$ indicated, respectively, by the arrows 47, 48, 49. The mirrors 44-46 are conveniently deposited by known electron beam deposition. The mirrors would be adjusted in wavelength to be optimal at the respective wavelengths of their emitting laser region.

As with the surface-skimming laser, the laser of FIG. 3 is characterized by lateral current flow, but with vertical cavities formed between layer 52 acting as a common bottom mirror and structures 44, 45 and 46 acting as mostly reflecting, slightly transparent top mirrors to allow exiting of the output radiations 47, 48, 49. Moreover, the laser embodiment of FIG. 3 is not limited to multiple beams of different wavelengths. A feature of my invention is a laterally-injecting laser with a vertical cavity for a beam output normal to the plane of the layers. A further feature is the foregoing in combination in a monolithic body with multiple active regions, preferably layered, but which progressively decrease in wavelength (increase in bandgap) as their distance from the top surface increases. Thus, selection of a particular wavelength output is easily obtained by selectively disabling longer wavelength active regions, if any, to access or enable the active region of the desired wavelength.

It will also be appreciated that the mirror formed by the stack of dielectric layers is not critical to this aspect of the invention. The top mirror can also be formed, for example, by a stack of semiconductor layers functioning to reflect radiation, or by a DBR stack, or by a III-V semiconductor compound layer.

Figure 4:
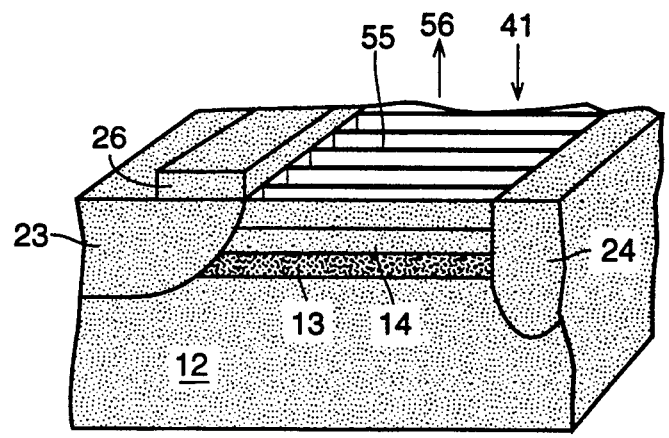
FIG. 4 is a detail view of part of another surface-skimming laser of the invention.

As described in the referenced '185 patent, by providing suitable gratings at the active surface, indicated schematically for one laser 41 at 55 in FIG. 4, then conventional grating surface emitting lasers result, indicated in FIG. 4 by the vertical arrows 56.

The structures depicted are readily made by conventional techniques well known in the art. Preferably the active layers are single quantum well regions. This has the advantage that the total thickness of the three active layers can be kept to a minimum, with the result that the entire series of three wavelengths could be accomplished by removing as little as 50 nm of material at the rightmost shortest wavelength laser. This means also that a minimal step height difference results which facilitates application in multiple beam polygon ROS systems.

Figure 5:
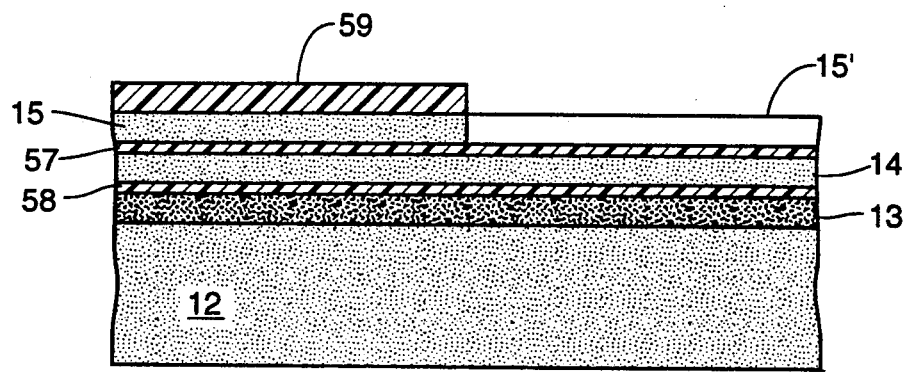
FIG. 5 is a view illustrating an intermediate step in the manufacture of a laser according to the invention.

Conventional etchants can be used for this semiconductor material removal. Etch-stop layers provided between the active regions prevents undesired removal of the underlying ultra-thin layer. For example, not meant to be limiting, FIG. 5 illustrates an intermediate step in the manufacture with etch-stop layers 57, 58, for example, of GaInP. FIG. 5 shows a conventional etch-resistant mask 59. With a conventional etchant such as $H_2O_2/H_3PO_4$, the active layer 15 at the dotted portion 15' could be etched off, with the etching stopping at etch-stop 57. Then an etchant such as HBr can be used to remove the exposed portion of etch-stop layer 57 where it is desired to etch off an underlying portion of the active region 14. Other etch-stop and etchant compositions will be evident to those skilled in the art.

In the preferred embodiments, the multi-layer structure is readily made by conventional epitaxial layer deposition techniques. Preferably, all epitaxial layers are p-doped, with the diffused regions n-doped, for example with silicon, to produce the desired p-n junctions, and the implanted regions p-doped or semi-insulating to isolate.

The invention also contemplates a single wavelength surface-skimming laser from a multi-wavelength structure of the type depicted in FIG. 1. In this case, the pre-layered structure as shown can be pre-fabricated. When a laser is desired with a wavelength equal to $\lambda_1$, $\lambda_2$ or $\lambda_3$, then the pre-fabricated structure is etched, to remove all quantum wells with emissions shorter than the desired wavelength in a given cavity, and suitable diffusion, implanting, and contact making steps carried out in order to produce one of the three lasers 20–22 shown in FIG. 2. Alternatively, the FIG. 2 structure can be shelved and made suitable to lase in a single wavelength by applying current across only one pair of the contacts.

The benefits of the invention include:

(a) closely-spaced multi-wavelength lasers on a common substrate, (b) reduced step height variations for better coupling to waveguide structures, (c) precise horizontal alignment of the several lasers since conventional photolithography techniques can be used to make the monolithic structure, the improved alignment providing better coupling to other optical structures, (d) close proximity of the laser active region to the surface which facilitates operation as grating surface emitting layers and for harmonic generation, as well as to incorporate conventional transistors into the structure.

It will be understood that the invention is not limited to the specific compositions given as examples. For example, in the FIG. 1 embodiment, another preferred combination would include InGaAs for active region 1, AlGaAs for active region 2, and AlGaInP for active region 3. Other combinations of materials will be evident from the referenced paper, patent, and copending application, whose contents are also incorporated herein.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. This scope of the invention is indicated by the appended claims rather than by the foregoing description.

WHAT IS CLAIMED IS:

1. A monolithic semiconductor device for making a surface-skimming laser comprising:
   (a) a body having a semiconductor substrate portion,
   (b) a stack of semiconductor layers on said substrate portion, said stack of layers being adjacent a surface of the body opposite said substrate portion and forming first and second lasing active regions of first and second, respectively, surface skimming lasers for generating first and second, respectively, radiation beams having, respectively, first and second wavelengths.

2. The device of claim 1, further comprising:
   (c) first means for contacting said first active region for generating said first radiation beam with a first wavelength.

3. The device of claim 2, further comprising:
   (d) second means for contacting said second active region for generating said second radiation beam with a second wavelength.

4. The device of claim 2, wherein the first means for contacting comprises lateral contacts to cause lateral current flow through said first active region.

5. The device of claim 4, wherein the first and second means for contacting comprise lateral contacts to cause lateral current flow through said first and second active regions, respectively.

6. The device of claim 1, wherein the first and second active regions are at different levels in the stack.

7. The device of claim 6, comprising an etch-stop layer between the first and second active regions.

8. A laser array comprising:
   (a) a common body having a semiconductor substrate portion,
   (b) a stack of semiconductor layers on said substrate portion, said stack of layers forming first and second lasing active regions of first and second surface-skimming lasers, respectively, for generating first and second, respectively, radiation beams having, respectively, first and second wavelengths,
   (c) means for contacting a first portion of said body to form the first laser having said first active region for generating said first radiation beam with a first wavelength,
   (d) means for contacting a second portion of said body to form the second laser having said second active region for generating said second radiation beam with a second wavelength.

9. A laser as claimed in claim 8, wherein said first active region is adjacent a surface of said body, and said second active region is adjacent a surface of said body.

10. The laser of claim 8, wherein the first active region is closer to the surface than the second active region, and the first active region has a smaller bandgap quantum well than that of the second active region.

11. A laser as claimed in claim 8, wherein said active regions are in close proximity to the body surface, and the contacting means comprise p-n junctions to supply transverse injection of current into the structure to activate the active regions.

12. A laser as claimed in claim 11, further comprising additional active regions, said active regions being at different levels in the stack of layers, said active regions having bandgaps monotonically increasing from the surface toward the substrate.

13. The laser of claim 11, further comprising an etch-stop layer between the active regions.

14. The laser of claim 11, wherein a portion of the first active region at the surface has been removed thereby exposing an underlying portion of the second active region.

15. The laser of claim 14, further comprising a grating or dielectric mirror stack over the exposed portion of the second active region.

16. A laser array comprising:
   (a) a common body having a semiconductor substrate portion,
   (b) a stack of semiconductor layers on said substrate portion, said stack of layers forming first and second lasing active regions of first and second vertical cavity lasers, respectively, for generating first and second, respectively, radiation beams normal to the plane of, the layers and having, respectively, first and second different wavelengths,
   (c) means for contacting a first portion of said body to provide lateral current injection to form the first laser having said first active region for generating said first radiation beam with a first wavelength,
   (d) means for contacting a second portion of said body to provide lateral current injection to form the second laser having said second active region for generating said second radiation beam with a second different wavelength.

17. A laser array comprising:
   (a) a common body having a semiconductor substrate portion,
   (b) a stack of semiconductor layers on said substrate portion, said stack of layers forming first and second lasing active regions of first and second vertical cavity lasers, respectively, for generating first and second, respectively, radiation beams normal to the plane of the layers and having, respectively, first and second wavelengths, said first active region being adjacent a surface of said body, said second active region being adjacent a surface of said body,
   (c) means for contacting a first portion of said body to provide lateral current injection to form the first laser having said first active region for generating said first radiation beam with a first wavelength,
   (d) means for contacting a second portion of said body to provide lateral current injection to form the second laser having said second active region for generating said second radiation beam with a second wavelength.

18. A laser array comprising:
   (a) a common body having a semiconductor substrate portion,
   (b) a stack of semiconductor layers on said substrate portion, said stack of layers forming first and second lasing active regions of first and second vertical cavity lasers, respectively, for generating first and second, respectively, radiation beams normal to the plane of the layers and having, respectively, first and second wavelengths, the first active region being closer to the surface than the second active region, the first active region having a smaller bandgap quantum well than that of the second active region,
   (c) means for contacting a first portion of said body to provide lateral current injection to form the first laser having said first active region for generating said first radiation beam with a first wavelength,
   (d) means for contacting a second portion of said body to provide lateral current injection to form the second laser having said second active region for generating said second radiation beam with a second wavelength.

19. A laser array comprising:
   (a) a common body having a semiconductor substrate portion,
   (b) a stack of semiconductor layers on said substrate portion, said stack of layers forming first and second lasing active regions of first and second vertical cavity lasers, respectively, for generating first and second, respectively, radiation beams normal to the plane of the layers and having, respectively, first and second wavelengths,
   (c) means for contacting a first portion of said body to provide lateral current injection to form the first laser having said first active region for generating said first radiation beam with a first wavelength,
   (d) means for contacting a second portion of said body to provide lateral current injection to form the second laser having said second active region for generating said second radiation beam with a second wavelength,
   (e) said active regions being in close proximity to the body surface, (f) the contacting means comprising p-n junctions to supply transverse injection of current into the structure to activate the 20. A method of making a laterally-injecting laser array comprising the steps:
   (a) providing a common body having a semiconductor substrate portion,
   (b) forming a stack of semiconductor layers on said substrate portion, said stack comprising first and second lasing active regions,
   (c) configuring said stack to form a first laterally-injecting laser comprising said first active region and a second laterally-injecting laser comprising a portion of said second active region laterally spaced from said first laser and capable of generating first and second, respectively, radiation beams having, respectively, first and second wavelengths,
   (d) contacting a first portion of said body to form a first laser having said first active region for generating said first radiation beam with first wavelength,
   (e) contacting a second portion of said body to form a second laser having said second active region for generating said second radiation beam with a second wavelength.

21. A method as claimed in claim 20, wherein said configuring step includes a step of removing a portion of the first active region at said second laser.

22. A method as claimed in claim 20, wherein said configuring step includes an etching step.

23. The method of claim 20, wherein said contacting steps are carried out so as to cause lateral current injection into the respective first and second active regions.

24. The method of claim 21, further comprising the step of depositing a reflecting structure over the first and second active regions.

* * * * *